(12) United States Patent
Endres et al.

(10) Patent No.: US 7,707,529 B2
(45) Date of Patent: Apr. 27, 2010

(54) METHOD FOR THE COMPUTER-AIDED ASCERTAINMENT OF A CLOCK TREE STRUCTURE, AND INTEGRATED SEMICONDUCTOR CIRCUIT

(75) Inventors: Heinz Endres, Gaukönigshöfen (DE); Thomas Zettler, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/250,078

(22) Filed: Oct. 13, 2005

(65) Prior Publication Data
US 2007/0083835 A1    Apr. 12, 2007

(30) Foreign Application Priority Data
Oct. 13, 2004    (DE) .................... 10 2004 049 745

(51) Int. Cl.
*G06F 17/50*    (2006.01)
(52) U.S. Cl. ............................. 716/6; 716/10
(58) Field of Classification Search ............ 716/6, 716/10
See application file for complete search history.

(56) References Cited

U.S. PATENT DOCUMENTS

| | | | | |
|---|---|---|---|---|
| 5,638,291 | A | 6/1997 | Li et al. ..................... | 364/490 |
| 6,311,148 | B1* | 10/2001 | Krishnamoorthy .......... | 703/19 |
| 6,574,781 | B1* | 6/2003 | Harada et al. .................. | 716/5 |
| 6,732,066 | B2* | 5/2004 | Krishnamoorthy .......... | 703/14 |
| 6,910,195 | B2* | 6/2005 | Akkiraju ..................... | 716/6 |
| 6,910,196 | B2* | 6/2005 | Cocchini ..................... | 716/6 |
| 6,915,497 | B2* | 7/2005 | Kitahara ..................... | 716/6 |
| 6,922,818 | B2* | 7/2005 | Chu et al. ..................... | 716/2 |
| 2003/0149950 | A1* | 8/2003 | Richling et al. .............. | 716/6 |
| 2004/0133867 | A1* | 7/2004 | Kitahara ..................... | 716/6 |
| 2004/0168140 | A1* | 8/2004 | Chang ........................... | 716/6 |
| 2004/0237060 | A1* | 11/2004 | Igarashi et al. ............... | 716/12 |
| 2006/0041852 | A1* | 2/2006 | Drumm et al. ............... | 716/10 |

FOREIGN PATENT DOCUMENTS

DE    103 01 696 A1    8/2004
WO    WO 2004/064477 A2    8/2004

OTHER PUBLICATIONS

Neil H.E. West et al.; "Principle of CMOS VLSI Design"; Chapter 4, pp. 238-240, Dec. 20, 2000.

* cited by examiner

*Primary Examiner*—Stacy A Whitmore
(74) *Attorney, Agent, or Firm*—Slater & Matsil, L.L.P.

(57) ABSTRACT

A method for the computer-aided ascertainment of a clock tree structure which couples a clock generation unit to a multiplicity of switching elements ascertains first switching elements from the multiplicity of switching elements, the first switching elements infringing a prescribed, first time-based switching criterion. In further method steps, the first switching elements are linked to the clock generation unit, and a first buffer element is inserted between the clock generation unit and the first switching elements. An integrated semiconductor circuit has a multiplicity of switching elements which are coupled to a clock generation unit via a clock tree structure. It also has a multiplicity of first switching elements which infringe a time-based switching criterion, which multiplicity is ascertained from the multiplicity of switching elements. A buffer element is inserted into the clock tree structure between the clock generation unit and the first switching elements.

13 Claims, 2 Drawing Sheets

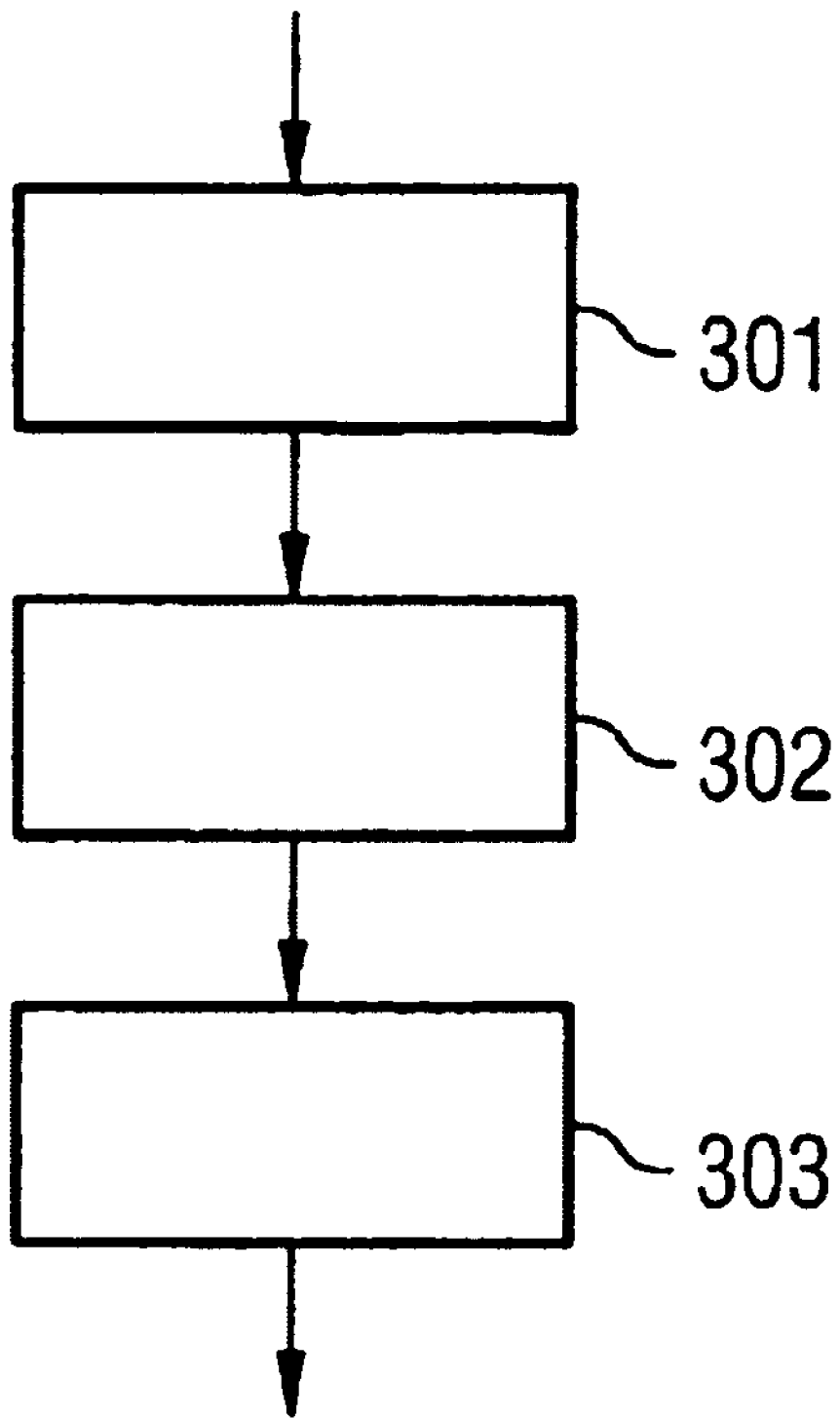

METHOD FOR THE COMPUTER-AIDED ASCERTAINMENT OF A CLOCK TREE STRUCTURE, AND INTEGRATED SEMICONDUCTOR CIRCUIT

CROSS-REFERENCE TO RELATED APPLICATIONS

This application claims foreign priority to Germany Application Number 10 2004 049 745.1 which was filed Oct. 13, 2004, and is herein incorporated by reference in its entirety.

TECHNICAL FIELD

The present invention relates to a method for the computer-aided ascertainment of a clock tree structure, to a method for the computer-aided creation of a layout for a semiconductor circuit and also to an apparatus for ascertaining a clock tree structure, to a computer-readable storage medium and to an integrated semiconductor circuit.

BACKGROUND

The continuously increasing complexity of integrated semiconductor circuits is leading to a range of requirements for the design of a layout for a circuit architecture. Ever decreasing feature sizes in process technology mean that local variations in the form of a switching element in a semiconductor circuit are arising more often. This significantly influences the propagation time response of signals in a logic cell or in a driver cell in the semiconductor circuit.

Such local variations, which are also called on chip variation (OCV), are negligible up to process technologies whose feature sizes are larger than 250 nm. In the case of smaller feature sizes, such as in 65 nm technology, local variations turn out to be in the order of magnitude of global fluctuations on the semiconductor circuit, however. It is therefore necessary to take suitable measures to ensure sound operation of the semiconductor circuit.

This problem is made worse by the fact that the aim when ascertaining a clock tree structure within the semiconductor circuit is, from a functional point of view, to ensure minimum propagation time differences for the clock signals arriving at switching elements in the semiconductor circuit. Ascertainment of such a clock tree structure is known from [1], for example. A further method for creating a clock tree structure is known from the German Application [2].

The need for synchronism within the semiconductor circuit means that certain changeover requirements need to be met on each switching element. The changeover requirements can be divided into two categories. The "setup" stipulates how long an input signal needs to be stable on a switching element before the next clock pulse is turned on. The "hold" condition, on the other hand, stipulates how long after a clock pulse— that is to say after a rising or falling edge of the clock signal— the input signal needs to remain stable on the switching element. Any infringement of the changeover requirements may result in a "metastable" state and consequently a malfunction of the switching element. To achieve safe operation of all of the switching elements in the semiconductor circuit, these are clocked simultaneously as far as possible. To supply the clock signal to a switching element while observing the changeover requirements, it is necessary to be able to provide the most accurately known propagation times possible for the signals and particularly for the clock signals on the switching elements.

When a clock tree structure is arranged unfavorably, it is much more difficult for the OCV to optimize the signal propagation time in the semiconductor circuit. The reason for this, inter alia, is that delay elements or driver cells in the clock tree structure may have different delay times on account of fluctuations in the respective process technology used. When the clock tree structure is generated, additional delay elements or driver cells and hence unnecessary surface area on an integrated component containing the semiconductor circuit and also additional and expensive development time for designing the semiconductor circuit are therefore required.

SUMMARY

The present invention is based on the problem of ascertaining a clock tree structure or providing an apparatus or a computer-readable storage medium having a computer program for ascertaining the clock tree structure, so that local variations within a process technology have a reduced influence on the variation of clock signal propagation times.

A further problem is to provide a method for creating a layout for a semiconductor circuit or to provide a semiconductor circuit, so that the semiconductor circuit contains a clock tree structure in which local variations within a process technology have a reduced influence on the variation of clock signal propagation times.

The method for the computer-aided ascertainment of a clock tree structure which couples a clock generation unit to a multiplicity of switching elements has the following steps:

first switching elements are ascertained from the multiplicity of switching elements, the first switching elements infringing a prescribed, first time-based switching criterion, the first switching elements are linked to the clock generation unit, and a first buffer element is inserted between the clock generation unit and the first switching elements.

The method identifies first switching elements whose switching response is critical and whose local variations within a process technology therefore make a significant contribution to possible malfunctions on account of their influence on the clock signal propagation times. The first switching elements are linked to the clock generation unit via a first buffer element. This means that all of the clock lines which are routed from the clock generation unit to a first switching element pass via the first buffer element, which may be in the form of a delay element or of a driver element, for example. A clock tree section is produced in the clock tree structure and connects the clock generation unit to the first switching elements. This clock tree section is decoupled from the rest of the clock tree structure by the first buffer element.

The effect achieved by this clock tree section is that the portion of the clock tree structure which is common to the first switching elements is as large as possible. In the interaction between the first switching elements, local variations in the clock tree structure therefore have no significance. In contrast to a known, hierarchically arranged clock tree structure, local variations within a process technology have a reduced influence on the variation of clock signal propagation times.

In addition, a method for the computer-aided creation of a layout for a semiconductor circuit is provided in which a clock tree structure is ascertained in the semiconductor circuit by carrying out an inventive method for ascertaining a clock tree structure. Next, the layout is created on the basis of the ascertained clock tree structure.

In addition, an apparatus is provided for ascertaining a clock tree structure with a processor which is set up such that an inventive method for ascertaining a clock tree structure can be executed.

Further, a computer-readable storage medium is provided which stores a computer program for ascertaining a clock tree structure which, when executed by a processor, has an inventive method for ascertaining a clock tree structure.

An integrated semiconductor circuit has a multiplicity of switching elements which are coupled to a clock generation unit via a clock tree structure, a multiplicity of first switching elements which infringe a time-based switching criterion, which multiplicity is ascertained from the multiplicity of switching elements, and a buffer element which is inserted in the clock tree structure between the clock generation unit and the first switching elements.

The semiconductor circuit accordingly has a clock tree structure which is created in line with the inventive method.

Advantageously, the method ascertains the first switching elements such that at least some of them are connected to one another via direct data links. Through the direct data links, one of the first switching elements influences, at the output time of a data signal, the input time of the data signal on a further first switching element. The first switching elements therefore influence each other's switching response on account of the direct data links.

It is advantageous that a clock tree section within the clock tree structure is produced which supplies the clock signal from the clock generation unit to first switching elements which influence each other's switching response. As a result, the whole circuit will react less sensitively to local variations in the process technology.

In addition or alternatively, the influence of the local variations can be reduced by ascertaining the first switching elements such that the physical distance between each pair of first switching elements is shorter than a maximum prescribed distance.

Hence, only switching elements which are in a physically limited area, or are arranged in sufficient physical proximity to one another in comparison with a prescribed distance criterion, are selected as first switching elements. As a result, the clock tree section couples first switching elements from an area of a circuit arrangement to the clock generation unit. In such an area, local variations in the process technology are so small that the clock signal propagation time response is influenced only to an insubstantial degree. The extent of the area is obtained from a prescribed maximum distance. This may be ascertained heuristically, for example, or is obtained from typical length scales for the local variations in the process technology.

The influence of the local variations is also limited by virtue of the first switching elements being ascertained such that the number of first switching elements is smaller than a prescribed maximum number.

Typically, the maximum number is determined from the number of first switching elements which is able to be supplied with a clock signal by the first buffer element without the arriving clock signal on a first switching element being too weak for sound operation.

In a further, advantageous development, the method has the following steps:

second switching elements which infringe a prescribed, second time-based switching criterion are ascertained from the multiplicity of switching elements, the second switching elements are linked to the clock generation unit, and a second buffer element is inserted between the clock generation unit and the second switching elements.

This creates a further clock tree section in the clock tree structure, which further clock tree section links the second switching elements to the clock generation unit.

Advantageously, the second switching elements are ascertained from the set of switching elements without the first switching elements. The set of first switching elements and the set of second switching elements are therefore disjunct. This means that two separate clock tree sections which respectively link the first switching elements or the second clock tree sections to the clock generation unit are produced in the clock tree structure. The clock tree structure is thus ascertained in the form of a plurality of mutually decoupled clock tree sections, as a result of which local variations have a small influence on the reliability of the overall clock tree structure.

In one advantageous, alternative embodiment, the second switching elements are ascertained from the set of first switching elements. The second buffer element is inserted between the first buffer element and the second switching elements. This produces a clock tree subsection in a clock tree section, which clock tree subsection is decoupled from the rest of the clock tree section. This produces even less sensitivity toward local variations.

The first time-based switching criterion is advantageously ascertained taking into account hold conditions and/or setup conditions on the switching elements. This means that a clock tree subsection is generated for switching elements which has critical changeover requirements on account of stringent hold or setup conditions. First switching elements which infringe a switching criterion ascertained in this manner are particularly sensitive to varying clock signal propagation times. Altered or incorrectly included clock signal propagation times may result in an incorrect response from a circuit arrangement.

Similarly, the second switching criterion is advantageously ascertained taking into account hold conditions and/or setup conditions on the switching elements. Thus, by way of example, the clock tree structure is ascertained such that one separate clock tree section is ascertained for switching elements with critical changeover requirements regarding a hold condition and a further separate clock tree section is ascertained for switching elements with critical changeover requirements regarding a setup condition.

In a further, advantageous development, the method has the following steps:

third switching elements meeting the first time-based switching criterion and the second switching criterion are ascertained from the multiplicity of switching elements, the third switching elements are linked to the clock generation unit, and a third buffer element is inserted between the clock generation unit and the third switching elements.

This produces a clock tree section which connects switching elements with uncritical changeover requirements to the clock generation unit. The clock tree thus has a structure in which generation of a clock tree section means that the branches which supply a clock signal to third switching elements with uncritical changeover requirements and the branches which supply the clock signal to the first and/or second switching elements with critical changeover requirements are decoupled from one another.

It can be regarded as advantageous if the method has the following step:

a clock signal arrival time on at least one third switching element is shifted by inserting at least one delay element between the third buffer element and the third switching element in order to minimize the number of third switching elements changing a switching state at the same time.

In the clock tree section which supplies the clock signal to the third switching elements, any actually simultaneous changeover of the third switching elements is thus prevented. This is done by shifting arrival times for the clock signal relative to one another on the third switching elements, ensuring that the functionality of the circuit which has the third switching elements is not impaired. When the clock tree structure is actually created, current spikes are largely prevented from arising in a voltage supply for the third switching elements. An exemplary method for creating such a clock tree structure section or a corresponding clock tree structure file is known from the German Application [2], which is incorporated into the content of the disclosure of the present application as well.

BRIEF DESCRIPTION OF THE DRAWINGS

The invention is explained in more detail below using a plurality of exemplary embodiments with reference to the drawing, in which:

FIG. 3 shows a flowchart for carrying out the method steps in line with a method based on the invention.

DETAILED DESCRIPTION

Figure 1:
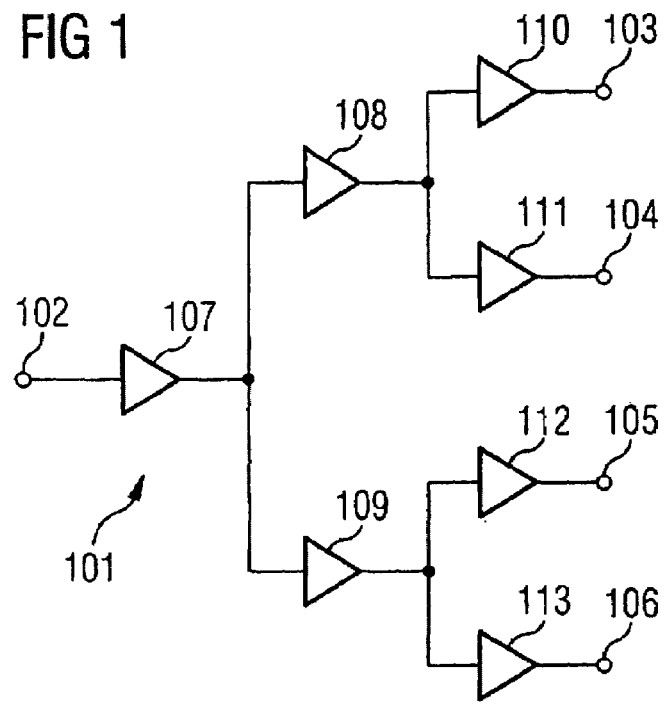
FIG. 1 shows a balanced clock tree structure.

FIG. 1 shows a balanced clock tree structure 101, as is ascertained using known methods. The clock tree structure 101 has a clock signal input 102 via which a clock signal is supplied to the clock tree structure 101 from a clock generation unit (not shown in the figure). In addition, the clock tree structure 101 has a first clock signal output 103, a second clock signal output 104, a third clock signal output 105 and a fourth clock signal output 106 in order to supply the clock signal to a respective switching element (likewise not shown).

The balanced clock tree structure 101 is arranged such that the switching elements coupled to the balanced clock tree structure switch as synchronously as possible. To this end, the clock signal input 102 is connected via a clock line to the input of a first buffer element in the form of a first delay element 107. The output of the first delay element 107 is for its part connected to the inputs of a second delay element 108 and a third delay element 109. The output of the second delay element 108 is connected to the inputs of a fourth delay element 110 and a fifth delay element 111. The output of the third delay element 109 is connected to the inputs of a sixth delay element 112 and a seventh delay element 113. Finally, the output of the fourth delay element 110 is connected to the first clock signal output 103, the output of the fifth delay element 111 is connected to the second clock signal output 104, the output of the sixth delay element 112 is connected to the third clock signal output 105, and the output of the seventh delay element 113 is connected to the fourth clock signal output 107.

The clock tree structure thus has a hierarchic arrangement which is essentially geared to switching the switching elements supplied with a clock signal via the clock tree's clock outputs synchronously. This clock tree structure has been ascertained on the basis of the assumption that local variations as a result of the process technology are ignored.

A method based on the invention or a development of this method also produces such a clock tree structure when no switching element infringes a switching criterion. In this context, the switching criterion is usually ascertained from the relation between the hold or setup conditions on the switching elements and any propagation time delays in the clock signal in the clock tree structure which are caused by the local variations. Provision is alternatively made for the switching criterion to be based on a heuristic value which is obtained from a series of experiments.

Figure 2:
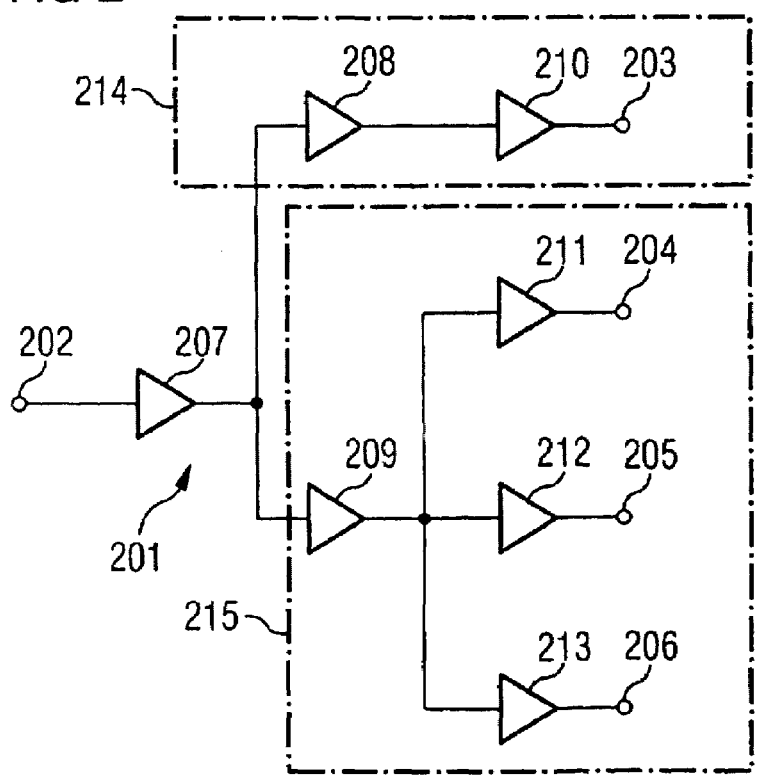
FIG. 2 shows a clock tree structure which has been ascertained using a method based on the invention.

FIG. 2 shows a clock tree structure 201 which has been ascertained in line with an exemplary embodiment of the invention. In the same way as in FIG. 1, the clock tree structure 201 has a clock signal input 202 via which a clock signal is supplied to the clock tree structure 201 from a clock generation unit (not shown in the figure). In addition, the clock tree structure 201 has a first clock signal output 203, a second clock signal output 204, a third clock signal output 205 and a fourth clock signal output 206 in order to supply the clock signal to a respective switching element (likewise not shown).

Unlike in FIG. 1, the switching elements which are coupled to the clock signal outputs are divided into two groups. In the exemplary embodiment shown, the first group of switching elements comprises only the switching element which is supplied with a clock signal via the first clock signal output 203 and meets a switching criterion which is determined from the changeover requirements. This switching criterion is obtained from the hold condition which exists on the switching element. The hold time on the switching element needs to be longer than a critical hold time. The second group of switching elements comprises the switching elements which are supplied with a clock signal via the second clock signal output 204, the third clock signal output 205 and the fourth clock signal output 206. The switching elements in the second group infringe the prescribed switching criterion. The hold times on the switching elements are accordingly shorter than the critical hold time.

The clock tree structure 201 shown in the exemplary embodiment is arranged such that the clock signal input 202 is connected via a clock line to the input of a buffer element in the form of a first delay element 207. The output of the first delay element 207 is connected to the input of a second delay element 208 and to the input of a third delay element 209. The output of the second delay element 208 is connected via a fourth delay element 210 to the first clock signal output 203. The output of the third delay element 209 is connected to the inputs of a fifth delay element 211, a sixth delay element 212 and a seventh delay element 213. Finally, the output of the fifth delay element 211 is connected to the second clock signal output 204, the output of the sixth delay element 212 is connected to the third clock signal output 205 and the output of the seventh delay element 213 is connected to the fourth clock signal output 207.

A clock tree structure 201 is thus produced which comprises a first clock tree section 214 (shown in dashes) and a second clock tree section 215 (likewise shown in dashes). In this case, the first clock tree section 214 contains the second delay element 208 and the fourth delay element 210. The second clock tree section 215 contains the third delay element 209, the fifth delay element 211, the sixth delay element 212 and the seventh delay element 213. The first clock tree section 214 and the second clock tree section 215 are respectively coupled to the clock generation unit via the first delay element 207.

The first clock tree section 214 and the second clock tree section 215 are decoupled from one another. In this case, the second group of switching elements has as large as possible a common share of the clock tree structure 201, which means that shifts in the clock signal propagation time as a result of variations in the delay elements appear equally on as many of the switching elements in the second group as possible. This, to a certain extent systematic, error in the clock supply can be corrected by virtue of a suitable choice of delay for the third delay element 209, for example, which in this case is inserted as a buffer or decoupling element. The safe operation of a circuit arrangement comprising the circuit elements is thus ensured.

FIG. 3 shows a flowchart for performing the method steps in line with a method based on the invention. It shows a first method step 301, a second method step 302 and a third method step 303, which are executed sequentially. In the first method step 301, the clock tree structure for switching elements with critical hold conditions is ascertained. In a second method step 302, the clock tree structure for switching elements with critical setup conditions is ascertained. In the third method step 303, the clock tree structure for switching elements with uncritical hold and setup conditions is ascertained.

Clearly, the method, which is subsequently also called a "common path optimization" method, has the following sequence:

first method step 301, optimization of the critical hold paths:
  minimization of the difference in the clock signal arrival times for the plurality of switching elements with critical hold conditions,
  maximization of the length of the common share of the clock tree (common path) for a clock tree section which is coupled to the switching elements with critical hold conditions,
second method step 302, optimization of the critical setup paths:
  minimization of the difference in the clock signal arrival times for the plurality of switching elements with critical setup conditions,
  maximization of the length of the common share of the clock tree (common path) for a clock tree section which is coupled to the switching elements with critical setup conditions,
third method step 303, optimization of the uncritical setup and hold paths:
  ascertainment of a clock tree structure for all other switching elements, for the purpose of the broadest possible random distribution of the clock signal arrival times on the other switching elements, in order to prevent simultaneous changeover of the other switching elements while simultaneously maintaining synchronous interaction of the other switching elements.

The "common path optimization" method can be implemented in various forms following the same basic pattern illustrated above. The text below shows a preferred form of the "common path optimization" method, as is used in a method for creating a layout for a semiconductor circuit.

In a first step, a list $L_{End}$ of all the terminal points in the clock tree structure is created. The terminal points are obtained, by way of example, from the clock signal inputs of switching elements provided in a circuit arrangement or of storing cells in the circuit arrangement. The terminal points are also obtained from clock outputs of the circuit arrangement or output ports in the design of the circuit arrangement which output a defined clock signal. The list $L_{End}$ is divided into four sublists. A first sublist $L_{EndRegister}$ comprises the clock signal inputs of all the registers or flipflops. A second sublist $L_{EndMacro}$ comprises the clock signal inputs of "macros", such as groups of switching elements, "glassboxes", memories etc. A third sublist $L_{EndNoClock}$ comprises all the terminal points in the clock tree structure which do not function as a clock signal input, such as reset inputs, output ports etc. Finally, a fourth sublist $L_{EndUser}$ comprises terminal points which are stipulated by the user of the method and which necessitate special handling when ascertaining the clock tree structure.

In a subsequent, second step, a table (also called hash table $H_{hold}$) combines those switching elements whose hold condition is observed only around time value which is smaller than a prescribed limit value. In addition, the hash table $H_{hold}$ stores the information regarding whether the switching elements shown are the closest neighbors to one another, i.e. that they are directly connected to one another in the network list of the circuit arrangement's layout, or whether they are the next but one neighbors to one another, i.e. that they are connected to one another via a single logic element.

Next, in a third step, a set of N clusters $C_i$, where i=1, ..., N, is formed from the terminal points of the first sublist $L_{EndRegister}$. A further cluster generation algorithm, described further below, minimizes the number of critical hold paths between the clusters formed. After that, a respective buffer element or decoupling buffer per cluster can be inserted into the clock tree, these respectively being placed at the focal center of the input pins of the associated cluster. An independent clock tree section is thus obtained for each cluster. A buffer element or a decoupling buffer is likewise inserted between the terminal points from the third sublist $L_{EndNoclock}$ and the clock generation unit, which means that an independent clock tree section is obtained in this case too. The same applies to the terminal points from the fourth sublist $L_{EndUser}$. Both clock tree sections are ascertained in line with an algorithm which optimizes the length of the clock lines and do not need to be considered further later. The clock tree sections routed to the clusters $C_i$ are ascertained such that the difference between the arrival times of the clock signal at the terminal points is minimized.

The clusters $C_i$ are formed such that at least one of the following criteria is met:
  the physical distance between the terminal points contained in a cluster is minimized;
  the direct data links between switching elements coupled to the terminal points are minimized in length;
  the number of switching elements which are coupled to the terminal points of a cluster is chosen such that a random distribution of this number over all the clusters $C_i$ is a random uniform distribution as far as possible.

The method for forming the clusters is carried out as follows, for example:
i) start at a first cluster $C_1$;
ii) repeat the following steps ii.a), ii.b) and ii.c) for a cluster $C_k$, where k=1, ..., N, for as long as terminal points are present in the first sublist $L_{EndRegister}$:
ii.a) insert a random terminal point from the first sublist $L_{EndRegister}$ into the cluster $C_k$;
ii.b) look for a first terminal point from the first sublist $L_{EndRegistert}$ so that a first switching element coupled thereto is the closest neighbor to a reference switching element, the reference switching element being coupled to a second terminal point from the cluster $C_k$, and the following conditions being met:
  the surface area of the first switching element and of the switching elements that are coupled to the terminal points of the cluster $C_k$ is minimal; and/or the cross section through the surface area is smaller than a limit value $d_{Max}$;

if the reference switching element meets these conditions, the terminal point coupled thereto is added to the cluster $C_k$. If the reference switching element does not meet the condition, a next but one neighbor of the first switching element is selected as new reference switching element and the whole of step ii.b) is repeated for the new reference switching element;

ii.c) step ii.b) is repeated until the number of terminal points which the cluster $C_k$ contains corresponds to a desired, prescribed, maximum number of terminal points in a cluster. This maximum number can be stipulated heuristically, for example.

i) steps ii) to ii.c) are repeated for a further cluster $C_1$, where $l \neq k$.

ii) if a pair of clusters $C_l$ and $C_k$, where $l \neq k$, exists whose common number of terminal points is less than or equal to the maximum number of terminal points per cluster $C_i$ then these can be combined into a single cluster.

In this method for creating the clusters, the maximum number of terminal points and the maximum physical extent of the cluster are included as fundamental parameters.

When the clusters $C_i$ have been formed, a residual list $L_{Remain}$ of those terminal points which have been ignored in the method to date is created. These terminal points are now also the buffer elements which have already been inserted into the clock tree structure by the method, and the terminal points shown in the second sublist $L_{EndMacro}$.

In a fourth step, the entire circuit arrangement is wired up (global routing).

In a fifth step, a graph G is ascertained which shows the links between those terminal points in the residual list $L_{Remain}$ which are critical with regard to a setup condition. By way of example, this may mean that there is a link in the graph when at least one signal path exists between the terminal points of the link whose setup delay is shorter than a time value $G_{Slackmax}$.

In each cohesive region from the graph G, a buffer element is inserted into the clock tree structure, so that the common path of the clock signal in the clock tree structure to the terminal points with critical setup conditions represents a maximum share of the respective clock path from the clock generation unit to the terminal point.

By way of example, this can be done such that the following method is carried out:

i) a rectangle of minimal surface area is generated which contains all the nodes in the graph G (bounding box);

ii) all the points of intersection, stipulated during the global wiring (global routing), in the clock tree structure with the rectangle determined in step i) are determined;

iii) if there is just one point of intersection, a buffer element is inserted into the clock tree structure at this point of intersection;

iv) if there are a plurality of points of intersection, the buffer element is placed at the position of that point of intersection which is at the shortest distance from the clock generation unit.

In a sixth step, all clock links to the terminal points in the residual list $L_{Remain}$ are ascertained with regard to a line-length optimized algorithm. The setup conditions can then be corrected by shifting the terminal points from the residual list $L_{Remain}$.

In a seventh step, all the terminal points which have been ignored to date, that is to say again including newly inserted buffer elements, are combined in a final list $L_{Currentreduction}$. For the terminal points in the final list $L_{Currentreduction}$, a method for creating a clock tree structure is now applied, as is known from [2], for example, in order to couple them to the clock generation unit. The effect achieved by this is that during operation of the circuit arrangement which has the clock tree structure any drawn current spikes in the voltage supply are smoothed on the clock tree. To this end, the method shown in [2] may be used.

In addition, the final list $L_{Currentreduction}$ may contain all the isolated nodes from the graph G, e.g. all those terminals from the residual list $L_{Remain}$ which are not coupled to switching elements with critical setup conditions.

To smooth the drawn current spikes, it is also possible to use the following smoothing method when creating the clock tree section at the terminal points in the final list $L_{Currentreduction}$:

a) a first reference terminal point is selected from the multiplicity of terminal points in the final list $L_{currentreduction}$;

b) a first reference arrival time for a clock signal is stipulated for the first reference terminal point, c) a clock signal arrival interval is determined for at least one terminal point, from the multiplicity of terminal points in the final list $L_{Currentreduction}$, which is coupled to the first reference terminal point by at least one signal link, d) an arrival time for the clock signal is stipulated for the terminal point within the clock signal arrival interval which (arrival time) has a different value than the first reference arrival time, and e) the first reference arrival time and the arrival time are stored in the clock tree structure file.

The clock signal arrival interval is determined by taking into account the first reference arrival time and a setup time and/or a hold time at the first reference terminal point. Step c) is repeated at least for a further terminal point from the multiplicity of terminal points in the final list $L_{Currentreduction}$ which terminal point is coupled to the first reference terminal point by at least one signal link, with the arrival time being stipulated within the clock signal arrival interval and being stored in the clock tree structure file. In this case, the clock signal arrival interval is determined by taking into account the arrival times and setup times and hold times for the terminal points whose arrival times have already been stipulated.

The arrival time of the clock signal at a terminal point is stipulated within the clock signal arrival interval such that a first optimization value ascertained from the arrival times is determined in minimal fashion. The first optimization value is chosen such that a minimum first optimization value corresponds to a maximum variance in a random distribution function for the arrival times.

The arrival time at a terminal point in the final list $L_{Currentreduction}$ is then shifted within the clock signal arrival interval such that a second optimization value ascertained from the arrival times is determined as a minimum. The two-stage adjustment of the arrival times first of all allows the distribution function for the arrival times to be made as shallow as possible. The optimum distribution ascertained in this process which optimum distribution stipulates the arrival times within the corresponding clock signal arrival intervals serves as a starting point for a further optimization step, which allows additional reduction of simultaneously switching terminal points or a specific characteristic of the distribution function for the arrival times. To this end, the second optimization value is chosen such that a minimum second optimization value corresponds to a maximum discrepancy between the fourth moment of the random distribution function of the arrival times and the fourth power of the mean value.

Preferably, all of said method steps in the smoothing method are respectively performed for terminal point groups from the multiplicity of terminal points in the final list $L_{Currentreduction}$ which are decoupled from one another. To this end, the following steps are performed prior to step c):

a second reference terminal point is selected from the multiplicity of terminal points in the final list $L_{Currentreduction}$ which (second reference terminal point) is coupled to the first reference terminal point at least via a signal link, and a second reference arrival time for the clock signal is stipulated for the second reference terminal point.

The second reference terminal point is chosen from the group of terminal points coupled indirectly to the first reference terminal point, and step c) is respectively performed for the terminal points coupled to the first reference terminal point and for the terminal points coupled to the second reference terminal point, disregarding the terminal points for which an arrival time has been stipulated. As a result, the smoothing method is performed iteratively. Starting from a first reference terminal point, all the adjacent and at least indirectly coupled terminal points in the final list $L_{Currenreduction}$ are gradually associated with arrival times for the clock signal.

In a final step, the placement and design of a clock tree within the semiconductor circuit is stipulated on the basis of the clock tree structure file.

The following publications have been cited in this document:
[1] Neil H. E. West and Kamram Eshragian; "Principle of CMOS VLSI Design", page 239, ISBN 0-201-53376-6;
[2] DE 10301696 A1.

LIST OF REFERENCE SYMBOLS 101, 201 Clock tree structure;
102, 202 Clock signal input;
103, 203 First clock signal output;
104, 204 Second clock signal output;
105, 205 Third clock signal output;
106, 206 Fourth clock signal output;
107, 207 First delay element;
108, 208 Second delay element;
109, 209 Third delay element;
110, 210 Fourth delay element;
111, 211 Fifth delay element;
112, 212 Sixth delay element;
113, 213 Seventh delay element;
214 First clock tree section;
215 Second clock tree section;
301 First method step;
302 Second method step;
303 Third method step.

The invention claimed is:

1. A computer-readable storage medium which stores a computer program for ascertaining a clock tree structure and which, when executed by a processor, comprises the following steps:

determining setup conditions and hold conditions on a multiplicity of switching elements, selecting first switching elements from the multiplicity of switching elements, the selecting based on whether the first switching elements infringe a prescribed, first time-based switching criterion, the first time-based switching criterion being based on the determined setup conditions and/or the determined hold conditions;

linking the first switching elements to a clock generation unit, and inserting a first buffer element between the clock generation unit and the first switching elements, wherein a time delay of a portion of the clock tree structure common to the first switching elements is increased.

2. The computer-readable storage medium according to claim 1, wherein the first switching elements are selected such that at least some of them are connected to one another via direct data links.

3. The computer-readable storage medium according to claim 1, wherein the first switching elements are selected such that a physical distance between each pair of first switching elements is shorter than a maximum prescribed distance.

4. The computer-readable storage medium according to claim 1, wherein the first switching elements are selected such that the number of first switching elements is smaller than a maximum prescribed number.

5. The computer-readable storage medium according to claim 1, wherein the computer program, when executed by the processor, further comprises the following steps:

selecting second switching elements which infringe a prescribed, second time-based switching criterion from the multiplicity of switching elements, linking the second switching elements to the clock generation unit, and inserting a second buffer element between the clock generation unit and the second switching elements.

6. The computer-readable storage medium according to claim 5, wherein the second switching elements are selected from the set of switching elements without the first switching elements.

7. The computer-readable storage medium according to claim 5, wherein the second switching elements are selected from the set of first switching elements, and the second buffer element is inserted between the first buffer element and the second switching elements.

8. The computer-readable storage medium according to claim 5, wherein the second time-based switching criterion is selected taking into account hold conditions and/or setup conditions on the switching elements.

9. The computer-readable storage medium according to claim 5, wherein the computer program, when executed by the processor, further comprises the following steps:

selecting third elements meeting the first time-based switching criterion and the second time-based switching criterion from the multiplicity of switching elements, linking the third switching elements to the clock generation unit, and inserting a third buffer element between the clock generation unit and the third switching elements.

10. The computer-readable storage medium according to claim 9, wherein the computer program, when executed by the processor, further comprises the following step:

shifting a clock signal arrival time on at least one third switching element by inserting at least one delay element between the third buffer element and the third switching element in order to minimize the number of third switching elements changing a switching state at the same time.

11. The computer-readable storage medium according to claim 1, wherein the computer program, when executed by the processor, further comprises creating a layout for a semiconductor circuit, in which the clock tree structure is ascertained.

12. An apparatus for ascertaining a clock tree structure comprising the computer-readable storage medium of claim 1.

13. An integrated semiconductor circuit comprising:
a multiplicity of switching elements,
a plurality of first switching elements selected from the multiplicity of switching elements that infringe a time-based switching criterion, the time-based switching criterion based on measured setup and hold conditions on the multiplicity of switching elements, and
a buffer element which is inserted in a clock tree structure coupled between a clock generation unit and the first switching elements, wherein a time delay of a portion of the clock tree structure common to the first switching elements is increased.

* * * * *